(12) United States Patent
Wu

(10) Patent No.: US 10,332,929 B2
(45) Date of Patent: Jun. 25, 2019

(54) INTEGRATED SENSING MODULE AND INTEGRATED SENSING ASSEMBLY USING THE SAME

(71) Applicant: Mei-Yen Lee, Hsin Chu (TW)

(72) Inventor: Hsien-Ming Wu, Taoyuan (TW)

(73) Assignee: Mei-Yen Lee, Hsin Chu (TW)

( * ) Notice: Subject to any disclaimer, the term of this patent is extended or adjusted under 35 U.S.C. 154(b) by 0 days.

(21) Appl. No.: 15/694,397

(22) Filed: Sep. 1, 2017

(65) Prior Publication Data

US 2018/0069048 A1 Mar. 8, 2018

Related U.S. Application Data

(60) Provisional application No. 62/420,041, filed on Nov. 10, 2016, provisional application No. 62/384,381, filed on Sep. 7, 2016.

(51) Int. Cl.
| | |
|---|---|
| H01L 27/146 | (2006.01) |
| G02B 5/20 | (2006.01) |
| H01L 27/15 | (2006.01) |
| H01L 27/32 | (2006.01) |
| G06K 9/00 | (2006.01) |

(52) U.S. Cl.
CPC ........ *H01L 27/14678* (2013.01); *G02B 5/208* (2013.01); *H01L 27/1462* (2013.01); *H01L 27/14618* (2013.01); *H01L 27/14632* (2013.01); *H01L 27/14636* (2013.01); *H01L 27/14687* (2013.01); *H01L 27/156* (2013.01); *H01L 27/3234* (2013.01); *G06K 9/00013* (2013.01)

(58) Field of Classification Search
CPC . H01L 51/56; H01L 51/5253; H01L 51/0097; H01L 2251/5338; H04N 5/2254

USPC ........................................................... 257/84
See application file for complete search history.

(56) References Cited

U.S. PATENT DOCUMENTS

| | | | |
|---|---|---|---|
| 6,061,463 A | 5/2000 | Metz et al. | |
| 9,177,984 B2 | 11/2015 | Izuha et al. | |
| 9,298,317 B2 | 3/2016 | Chou | |
| 9,818,017 B2 * | 11/2017 | Wu .................... | G06K 9/00046 |
| 2010/0067757 A1 | 3/2010 | Arai et al. | |
| 2012/0249829 A1 | 10/2012 | Izuha et al. | |

(Continued)

FOREIGN PATENT DOCUMENTS

| | | |
|---|---|---|
| JP | 2016005862 A | 1/2016 |
| TW | 201246926 A | 11/2012 |
| TW | 201426563 A | 7/2014 |

OTHER PUBLICATIONS

Taiwan office action issued in application 10720118520, dated Feb. 7, 2018, 11 pages.

*Primary Examiner* — Andy Huynh

(74) *Attorney, Agent, or Firm* — Muncy, Geissler, Olds & Lowe, P.C.

(57) ABSTRACT

An integrated sensing module includes: an image sensing chip including photo sensing units arranged in a two-dimensional array; a micro-hole layer disposed on the image sensing chip and having one or multiple micro holes corresponding to the photo sensing units, wherein the photo sensing units sense an optical image of an object through the one or multiple micro holes; and a transparent cover or a transparent cover assembly disposed over the micro-hole layer. An integrated sensing assembly using the integrated sensing module is also provided.

20 Claims, 14 Drawing Sheets

(56) References Cited

U.S. PATENT DOCUMENTS

| | | | |
|---|---|---|---|
| 2014/0042406 A1* | 2/2014 | Degner | H01L 27/326 257/40 |
| 2014/0168167 A1 | 6/2014 | Chou | |
| 2015/0372185 A1* | 12/2015 | Rossi | H01L 31/1876 438/27 |
| 2016/0132176 A1 | 5/2016 | Bae et al. | |
| 2016/0224816 A1* | 8/2016 | Smith | G02B 27/58 |
| 2017/0092702 A1* | 3/2017 | Xu | G09G 3/2096 |
| 2017/0182567 A1 | 6/2017 | Okude et al. | |

* cited by examiner

INTEGRATED SENSING MODULE AND INTEGRATED SENSING ASSEMBLY USING THE SAME

This application claims priorities of U.S. Provisional Patent Application Ser. No. 62/384,381, filed on Sep. 7, 2016; and No. 62/420,041, filed on Nov. 10, 2016, the entire contents of which are hereby incorporated by reference.

BACKGROUND OF THE INVENTION

Field of the Invention

The invention relates to an integrated sensing module and a method of manufacturing the same, and more particularly to an integrated sensing module using the micro hole imaging principle to achieve the biometrics characteristics sensing and a method of manufacturing the same.

Description of the Related Art

A conventional optical biometrics sensor, such as an optical fingerprint sensor, utilizes an optical imaging device, such as a CMOS image sensor (CIS) or a charge coupled device (CCD) image sensor, to sense the biometrics characteristics, wherein one lens set or an array of lens sets may be used to perform the direct optical sensing.

FIG. 1 shows a conventional optical fingerprint sensor 500, Referring to FIG. 1, which works according to the total reflection principle of light between a fingerprint FP and an optical surface plane (usually a surface plane 512 of a prism 510) in contact with the fingerprint FP, so that a fingerprint image is constructed on an image sensor 530. This sensing principle has the major drawback that the dry finger cannot be sensed to have the good continuity texture image, so that the misreading problem occurs when the minutia points are being extracted. Meanwhile, it is also necessary to provide a collimated light source 520 emitting light for the total reflection principle. This also increases the cost and the design complexity. In addition, such the sensing module is formed by assembling different members, so that the manufacturing process is time-consuming and labor-consuming, and the quality cannot be easily controlled. Thus, the mass production cannot be made and the cost is also high.

Another drawback of the conventional optical fingerprint sensor is that the size is very large and is suitable for the application occasion of the large-size product, such as an entrance security control system. When the fingerprint sensor is to be applied to a slim device, such as a mobile phone, the thickness must be limited to be smaller than 1 mm. Thus, the mainstream product at present is still the capacitive fingerprint sensor, which needs to be disposed under the button, or an opening of the front side or backside of the mobile phone needs to be formed to damage the outlook and get dirty. In addition, the capacitive fingerprint sensor also has other drawbacks. For example, if it is to be placed under the glass panel, then the capacitance between the sensing unit and the fingerprint is far smaller than 1 fF, so that the sensitivity is poor. With the development of the mobile phone, the edgeless display becomes the future trend. Thus, the capacitive fingerprint sensor further cannot be disposed under the display.

SUMMARY OF THE INVENTION

It is therefore an object of the invention to provide an integrated sensing module and a method of manufacturing the same, wherein the micro-hole imaging principle is used in conjunction with the semiconductor wafer manufacturing method to stack the optical module onto the optical sensing chip by way of wafer stacking to complete the structure thereof, so that the size is minimized, the manufacturing processes are standardized, the quality is easily controlled, and the cost is advantageously decreased.

Another object of the invention is to provide an integrated sensing module and a method of manufacturing the same, wherein the optical image sensing effect can be performed using one single micro hole, and the integrated sensing module may be further integrated with a display easily to achieve the display, touch and fine biometrics characteristics sensing effects.

To achieve the above-identified object, the invention provides an integrated sensing module including: an image sensing chip including photo sensing units arranged in a two-dimensional array; a micro-hole layer disposed on the image sensing chip and having one or multiple micro holes corresponding to the photo sensing units, wherein the photo sensing units sense an optical image of an object through the one or multiple micro holes; and a transparent cover or a transparent cover assembly disposed over the micro-hole layer.

The invention further provides an integrated sensing assembly including: a circuit board; a light source disposed on the circuit board; and the integrated sensing module. The integrated sensing module is disposed on the circuit board and electrically connected to the circuit board, the light source is disposed on one or multiple sides of the transparent cover or the transparent cover assembly, and light rays of the light source project from a side surface of the transparent cover or the transparent cover assembly onto the object.

The invention also provides a method of manufacturing an integrated sensing module. The method including: providing an image sensing chip including photo sensing units arranged in a two-dimensional array; forming a patterned optical substrate on the image sensing chip, wherein the patterned optical substrate is a portion of a micro-hole layer, the micro-hole layer is disposed on the image sensing chip and has one or multiple micro holes corresponding to the photo sensing units, wherein the photo sensing units sense an optical image of an object through the one or multiple micro holes; and forming a transparent cover or a transparent cover assembly over the micro-hole layer, wherein the photo sensing units sense the optical image of the object, disposed on or over the transparent cover or the transparent cover assembly, through the micro hole or micro holes.

With the above-mentioned embodiment, an integrated sensing module may be provided, wherein the semiconductor wafer manufacturing method is utilized to stack the optical module onto the optical sensing chip by way of wafer stacking to complete the structure thereof and overcome all the drawback of the prior art, so that the size is minimized, the manufacturing processes are standardized, the quality is easily controlled, and the cost is advantageously decreased. One single micro hole or multiple micro holes may be utilized to perform the optical image sensing effect, and the integrated sensing module may be further integrated with a display easily to achieve the display, touch and fine biometrics characteristics sensing effects.

Further scope of the applicability of the invention will become apparent from the detailed description given hereinafter. However, it should be understood that the detailed description and specific examples, while indicating preferred embodiments of the invention, are given by way of illustration only, since various changes and modifications

DETAILED DESCRIPTION OF THE INVENTION

The main spirit of the following embodiments relates to a structure of an integrated sensing module, wherein the semiconductor wafer manufacturing method is utilized to stack the optical module onto the optical sensing chip by way of wafer stacking to complete the structure thereof and overcome all the drawback of the prior art, so that the size is minimized, the manufacturing processes are standardized, the quality is easily controlled, and the cost is advantageously decreased.

Figure 1:
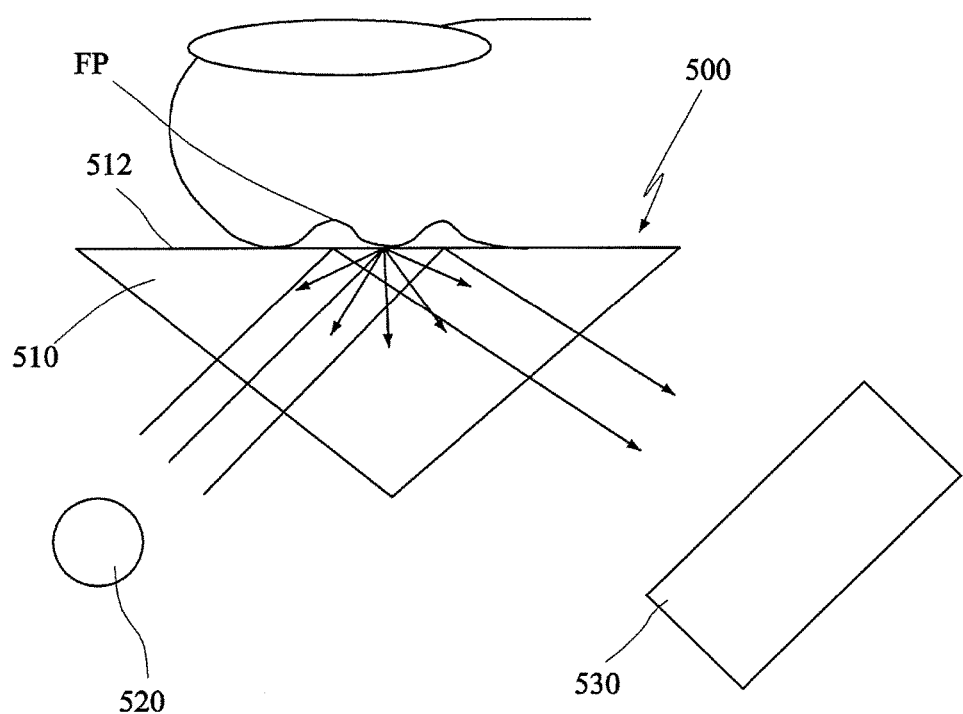
FIG. 1 shows a conventional optical fingerprint sensor.
Figure 2A:
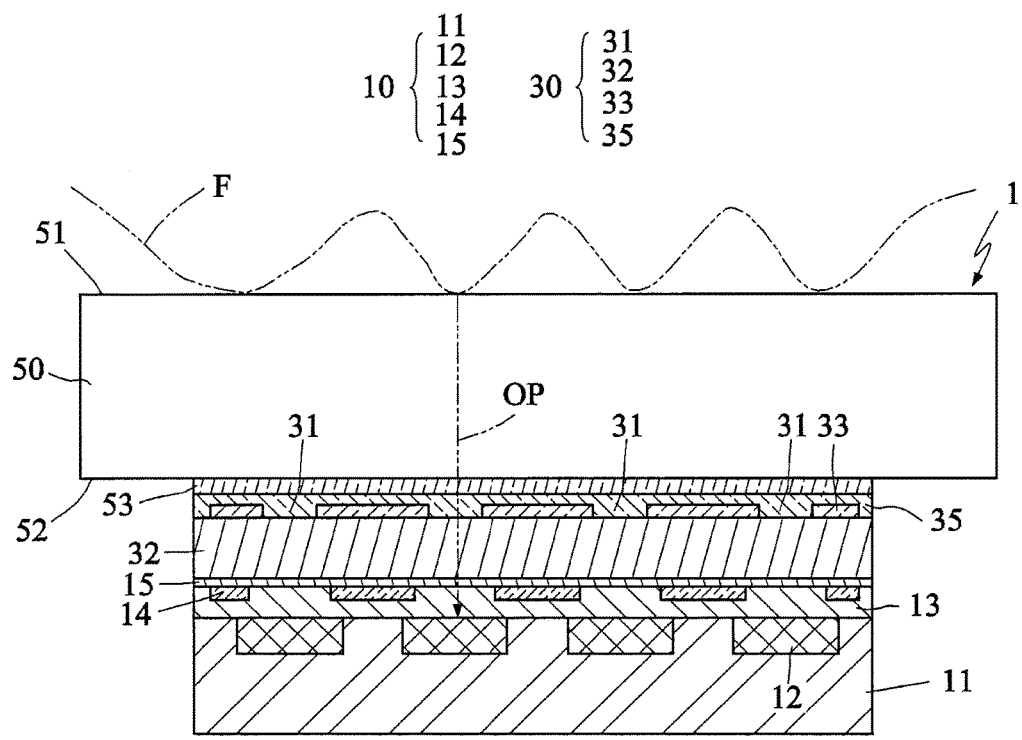
FIG. 2A is a schematic view showing an integrated sensing module according to a first embodiment of the present invention.

FIG. 2A is a schematic view showing an array image sensing module or an integrated sensing module 1 according to a first embodiment of the present invention. Referring to FIG. 2A, the array image sensing module 1 includes: an image sensing chip 10, including photo sensing units 12 arranged in a two-dimensional array; and a micro-hole layer 30 disposed on the image sensing chip 10 and having multiple micro holes 31 arranged in a two-dimensional micro-hole array, the micro holes 31 corresponding to the photo sensing units 12 (may be a one-to-one, one-to-many or many-to-one geometric arrangement to match with the system design upon application without departing from the basic architecture and principles of the invention), wherein the photo sensing units 12 sense an optical image of an object F through the micro holes 31 (through the light path OP). The optical image can be a skin/dermal fingerprint image, a subcutaneous vein image and/or the array image sensing module may measure other biometrics images or information, such as blood oxygen concentration, heartbeat information or the like.

The image sensing chip 10 includes a semiconductor substrate 11 and the photo sensing units 12 formed in the substrate 11, and can further include an inter-metal dielectric (IMD) layer set 13 (there may actually be multiple IMD layers and metal connection layers disposed on the substrate and the photo sensing units), an upper metal layer 14 (disposed on the IMD layer set 13) and a protection layer 15 (disposed on the IMD layer set 13 and the upper metal layer 14). The upper metal layer 14 may be used as a light obstructing layer for obstructing partial light rays from the micro holes 31 to the photo sensing units 12 to avoid the light rays from mutual interfering with each other as well as to restrict the light path and/or light amount. The protection layer 15 is, for example, silicon oxide/silicon dioxide or other insulating layer materials for covering the upper metal layer 14.

Figure 2B:
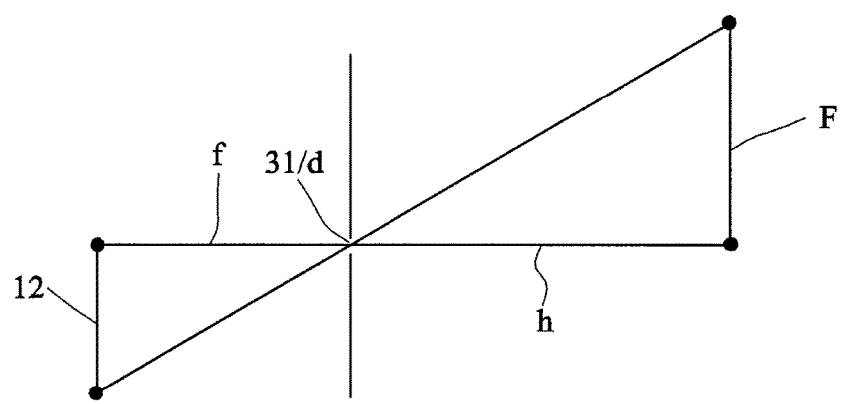
FIG. 2B is a schematic view showing micro-hole imaging.

FIG. 2B is a schematic view showing micro-hole imaging. The invention uses the principle of the micro-hole imaging, and the formula used to calculate the optimal diameter of the micro-hole s is as follows:

$$d=\sqrt{2f\lambda}$$

where f is a focal length, and λ is a wavelength of light. The wavelength of the red light is 700 nm, the wavelength of the green light is 546 nm, and the wavelength of the blue light is 436 nm. The average of the wavelengths of the red light and the green light (that is, 623 nm) is usually taken upon calculation.

The focal lengths from the micro holes 31 to the photo sensing units 12 depend on the system design and range between 100 and 1000 microns (um), especially between 150 and 600 um. The following shows some of the calculated results.

| f(um) | λ (nm) | d(um) | Remarks |
|---|---|---|---|
| 150 | 940 | 16.79286 | infrared light |
| 300 | 940 | 23.74868 | infrared light |
| 150 | 700 | 14.49138 | red light |
| 300 | 700 | 20.4939 | red light |
| 150 | 546 | 12.79844 | green light |
| 300 | 546 | 18.09972 | green light |
| 150 | 436 | 11.43678 | blue light |
| 300 | 436 | 16.17405 | blue light |

The calculated aperture "d" of the micro hole 31 may be between about 10 and 25 um. Of course, such the scale can be implemented using the current semiconductor lithography technology.

As shown in FIG. 2A, the array image sensing module 1 further includes a transparent cover 50 disposed on the micro-hole layer 30, wherein the object F is in contact with an upper surface 51 of the transparent cover 50, and the array image sensing module 1 and the transparent cover 50 can be referred to as the integrated sensing module. An adhesive agent 53 (it is of course not limited to a single layer of material, and may also be referred to as an adhesive layer) adheres a lower surface 52 of the transparent cover 50 to a protection layer 35 (the protection layer 35 may also be omitted in another embodiment). The transparent cover 50 is not an essential element, because other structures may also be adopted to make the image sensing chip 10 sense the optical image. In this embodiment, the transparent cover 50 can be a display cover of the mobile phone. This represents that the array image sensing module is disposed under the display cover of the mobile phone (referred to as an under glass module), or the transparent cover is not limited to a single homogeneous material, and may be a multi-layers heterogeneous combination (the transparent cover assembly defined in the following), such as an OLED display panel assembly structure having a partial transparent design to facilitate the light path OP to pass. This represents that the array image sensing module is disposed under the display of the mobile phone (referred to as an under display module), especially a portion of an organic light emitting diode (OLED) display or micro light-emitting diode (LED) display.

Figure 5:
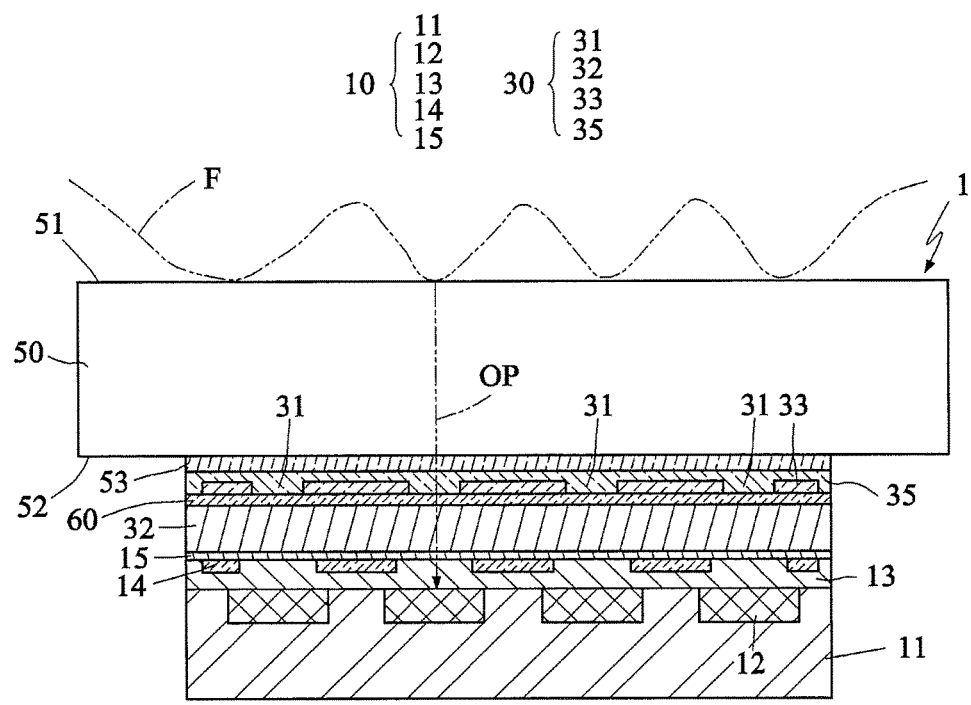
FIG. 5 is a schematic view showing a modified example of the integrated sensing module of FIG. 2.

The micro-hole layer 30 may be formed of a transparent substrate 32 and a patterned metal layer 33 formed on the transparent substrate 32, wherein the top surface of the patterned metal layer 33 can be covered with the protection layer 35, and the protection layer 35 may also be omitted in another embodiment. In addition, the protective layer itself may also be an optical filter only let specific wavelengths of light (e.g., infrared light) pass, or an optical filter 60 may be disposed between the transparent substrate 32 and the patterned metal layer 33, as shown in FIG. 5, or the optical filter 60 may be disposed between the image sensing chip 10 and the transparent substrate 32 or above the patterned optical substrate (not shown, wherein the optical filter may also be regarded as not pertaining to one portion the micro-hole layer). The transparent substrate material is, for example, glass, quartz and sapphire and so on. The advantage of the invention adopted is, as compared with the condition using the polymeric material, the difference between the coefficients of thermal expansion of the transparent substrate material and the sensing chip substrate (e.g., silicon or the like) is smaller, and the generated thermal stress is relatively low, so that the stable quality is obtained.

The thickness of the transparent cover 50 ranges between 300 and 1000 um, preferably between 500 and 900 um, more preferably between 600 and 800 um, much more preferably between 650 and 750 um, and is most preferably equal to about 700 um. However, this does not intend to restrict the invention thereto.

The manufacturing method will be described below.

Figure 3A:
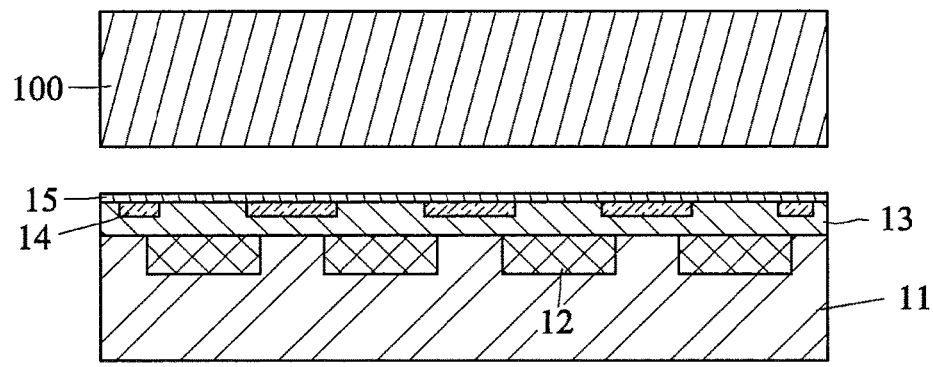
FIGS. 3A to 3F are schematic views showing steps in a method of manufacturing the integrated sensing module according to the preferred embodiment of the invention.
Figure 3B:
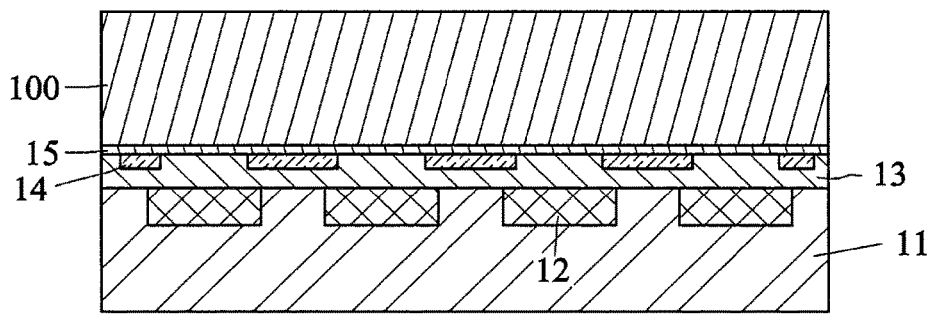

As shown in FIG. 3A, the manufacturing of the invention is wafer level manufacturing. For the sake of illustration, the schematic scale of the partial chip is described herein. First, an image sensing chip 10, such as but without limitation to a CMOS Image Sensor (CIS) fabricated using a CMOS process, is provided. Then, a transparent substrate 100 is bonded to the image sensing chip 10, as shown in FIG. 3B, wherein the low-temperature fusion bonding, adhering or other technology may be used. Alternatively, multiple array image sensing modules 1 may also be manufactured at a time using the wafer level manufacturing technology. In this case, a first wafer (the silicon wafer is used in this embodiment but provides no limitation while the image chip may be of the front-side illumination (FSI) or back-side illumination (BSI)) including multiple image sensing chips 10 is firstly provided. Then, a second wafer (transparent substrate 100) is bonded to the first wafer. Next, the following steps are performed, and finally dicing is performed. For the sake of simplicity, the production of the single array image sensing module 1 will be described in the following.

Figure 3C:
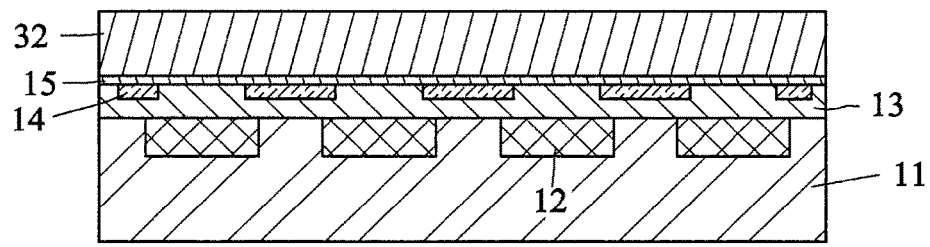

Then, as shown in FIG. 3C, the transparent substrate 100 is thinned down by way of grinding, polishing or surface treatment to produce the transparent substrate 32 with the predetermined thickness. Because this thickness is very close to the focal length f, using the semiconductor wafer manufacturing process to control is further advantageous to the increases of the yield and quality as compared with the conventional machining and assembling method.

Figure 3D:
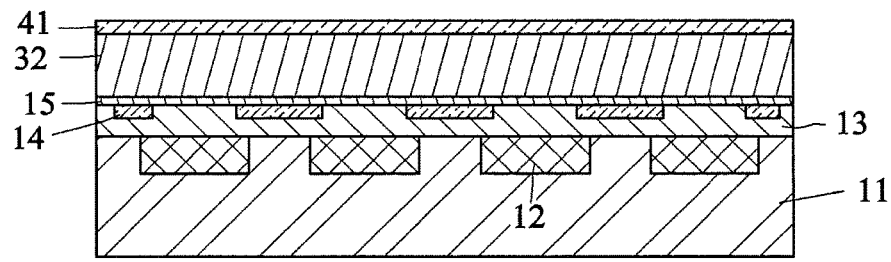
Figure 3E:
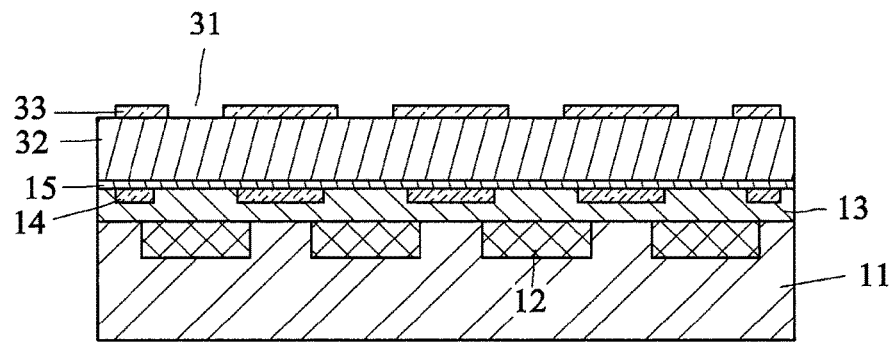

Next, as shown in FIG. 3D, a metal layer 41 is formed on the transparent substrate 32, and then the photoresist is coated, exposed, developed and etched to pattern the metal layer 41 and to form the patterned metal layer 33, and then the remained photo resist layer is removed, as shown in FIG. 3E.

When the optical filter 60 is disposed between the transparent substrate 32 and the patterned metal layer 33, as shown in FIG. 5, an optical filter 60 may be formed on the transparent substrate 32 first, and then the step of forming the metal layer 41 on the optical filter 60 and the associated steps are performed, wherein detailed descriptions thereof will be omitted. The above-mentioned step may be interpreted as forming a patterned optical substrate on the image sensing chip.

Figure 3F:
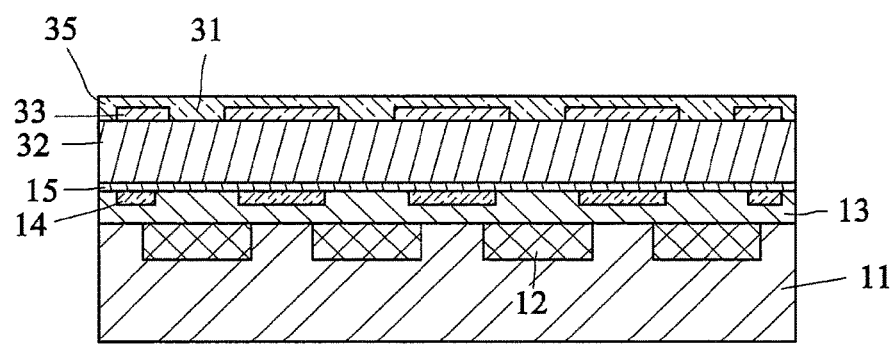

Then, as shown in FIG. 3F, the protection layer 35 is formed on the patterned metal layer 33 and the transparent substrate 32. In practical application, the adhesive agent 53 can be used to adhere the protection layer 35 to the transparent cover 50, such as the display module or the cover glass of the mobile phone.

Figure 4A:
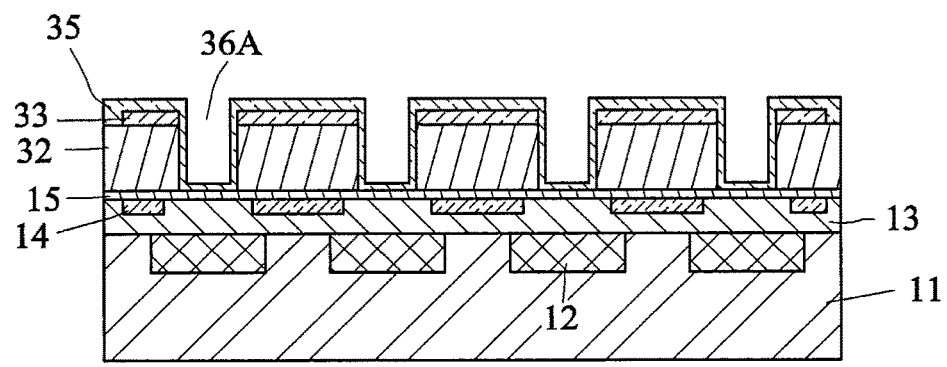
FIGS. 4A to 4F are schematic views showing multiple examples of the transparent substrate.
Figure 4B:
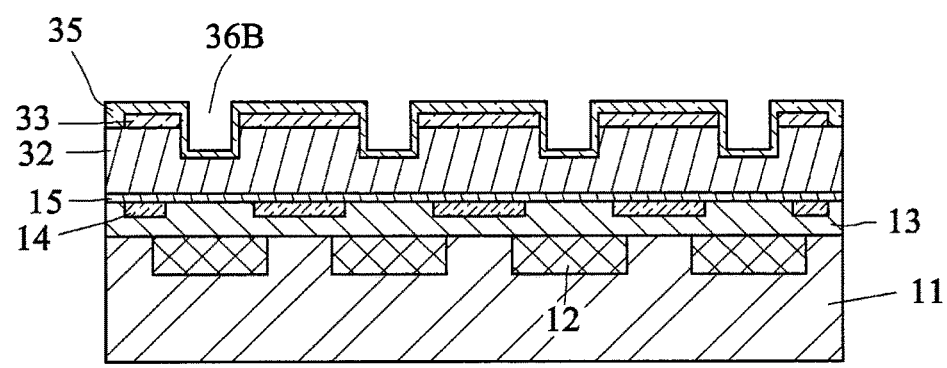
Figure 4C:
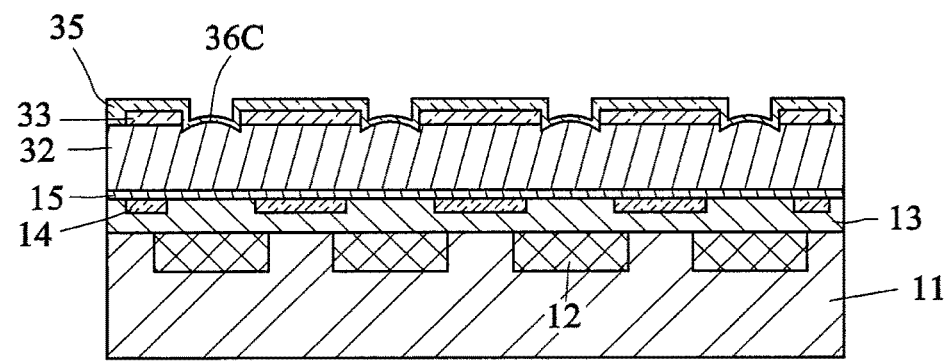
Figure 4D:
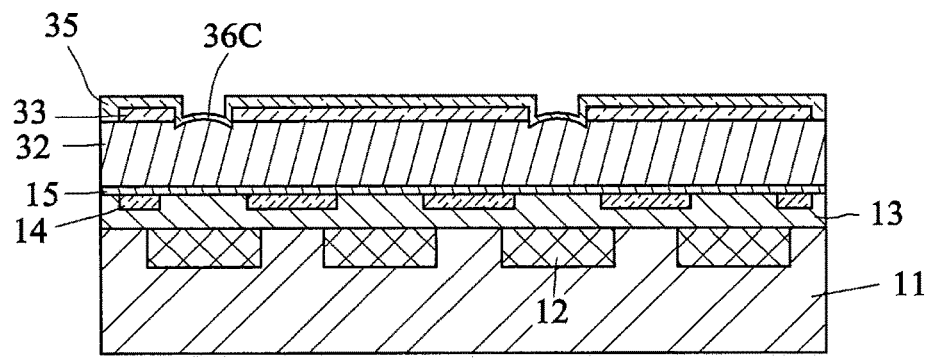
Figure 6:
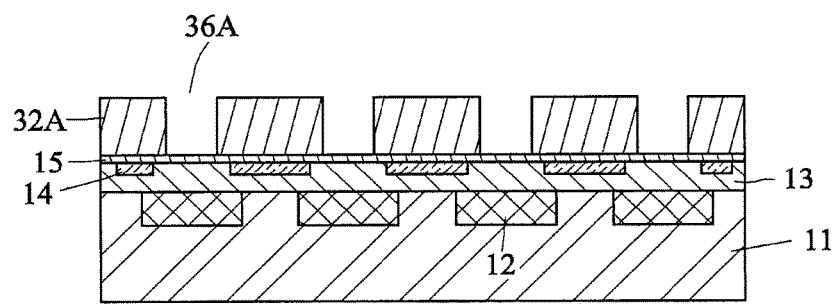
FIG. 6 is a schematic view showing another modified example of the transparent substrate.

The transparent substrate 32 may be solid (FIG. 3F), hollow (FIG. 4A, formed with a deep trench 36A), or the mixture of solid and hollow structures (FIG. 4B, formed with a shallow trench 36B). The transparent substrate 32 may also provide the light gathering or converging (the convex curved surface 36C of FIG. 4C) or light diverging (similar to FIG. 4C, not shown) effect to further adjust the light path. As shown in FIG. 4D, all first portions of the transparent substrate 32 corresponding to the micro holes 31 have the light converging or diverging effect, while the second portions thereof do not have the light converging or diverging effect, so that different depths of images can be sensed. Of course, if the hollow design as shown in FIG. 4A is adopted, then the transparent substrate 32 may also be replaced with an opaque substrate 32A (e.g., silicon substrate or the like). At this time, the protection layer 35 and the patterned metal layer 33 can be omitted to have the structure shown in FIG. 6. In this case, only the opaque substrate 32A needs to be patterned. The transparent substrate 32 and the opaque substrate 32A may also be generalized as an optical substrate, so the micro-hole layer includes a patterned optical substrate, wherein the patterned structure may be formed by etching through the optical substrate, etching the optical substrate with etching through the optical substrate or using a patterned light-obstructing or black glue layer to cover the optical substrate to form the associated corresponding structure of the micro hole(s). For example, the patterned optical substrate may be the combination of the transparent substrate 32 and the patterned metal layer 33, but the invention is not restricted thereto.

Figure 4E:
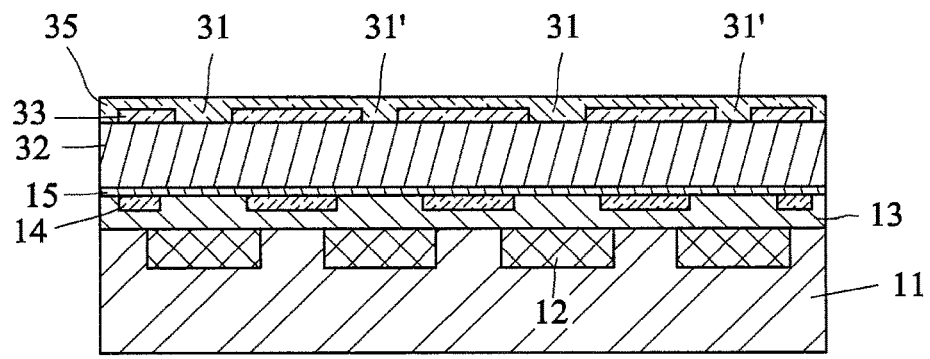

As shown in FIG. 3F, all the micro holes 31 have the same aperture (d). As shown in FIG. 4E, the micro holes 31 and 31' have different apertures (d), such as two, three or four sets of apertures (d) arranged alternately, and work in conjunction with different wavelengths of light sources, so that different depths of images can be sensed. For example, the skin layer, the dermal layer and the finger vein images are sensed concurrently. Such the design cannot be made in the conventional optical sensing module, and is another characteristic of the invention. This concept is also applicable to FIGS. 4A, 4B, 4C, 4D and 6.

Figure 4F:
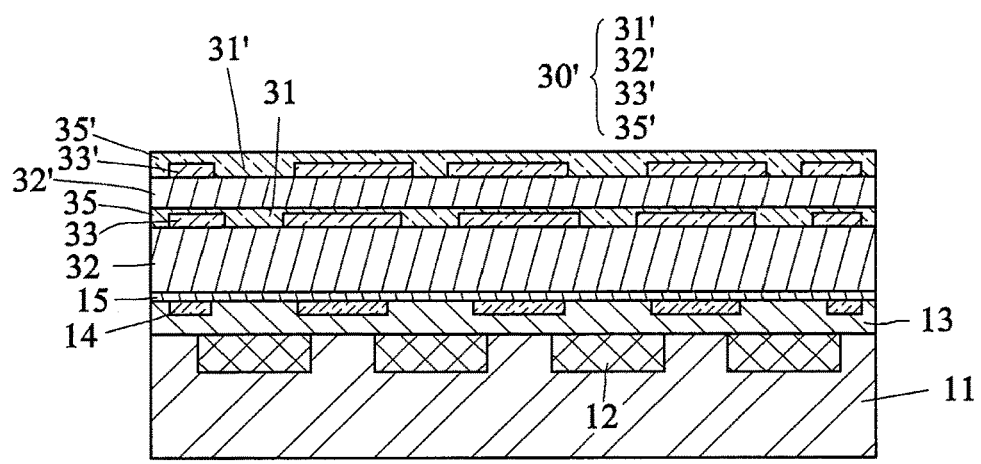

As shown in FIG. 4F, different sizes of micro holes 31 and 31' of two sets of micro-hole layers 30 and 30' are utilized to achieve the effect of sensing different depths of images. It is possible to manufacture the product by performing the manufacturing method similar to FIGS. 3A to 3F based on the structure of FIG. 3F to form a transparent substrate 32', a patterned metal layer 33' and a protection layer 35' of another micro-hole layer 30' on the protection layer 35 in order.

The invention also provides an electronic apparatus installed with the above-mentioned array image sensing module, wherein the electronic apparatus may be the mobile phone or the tablet computer etc., and the transparent cover 50 is the display (especially the touch display) of the electronic apparatus, more particularly an organic light emitting diode (OLED) display or micro light-emitting diode (LED) display.

In order to sense the biometrics image, the integrated sensing module itself must have the array sensing member structure, which is also referred to as an array image sensing module.

Figure 7:
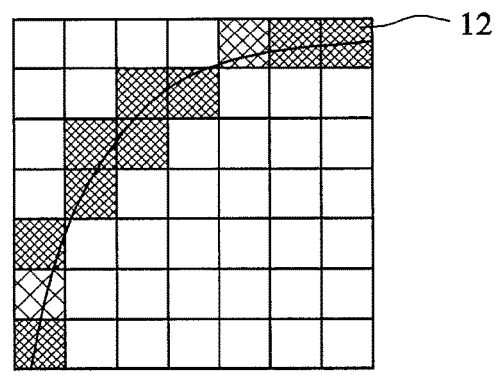
FIG. 7 shows one example of gray scale values of the photo sensing unit put together into an image.

In the above-mentioned embodiment, the micro holes correspond to the photo sensing units in a one-to-one manner. Thus, the sensing value obtained by each photo sensing unit and the imaging through each micro hole only has the gray scale. Putting the sensing values of all the photo sensing units through the imaging of all the micro holes can obtain the biometrics image, as shown in FIG. 7, which shows one example of gray scale values of the photo sensing unit put together into an image. It is worth noting that all the above-mentioned similar characteristics are applicable to the following integrated sensing module.

The following embodiment provides an integrated sensing module, wherein one micro hole corresponds to many photo sensing units. Thus, the photo sensing unit can obtain the biometrics image through the imaging principle of one micro hole.

Figure 8:
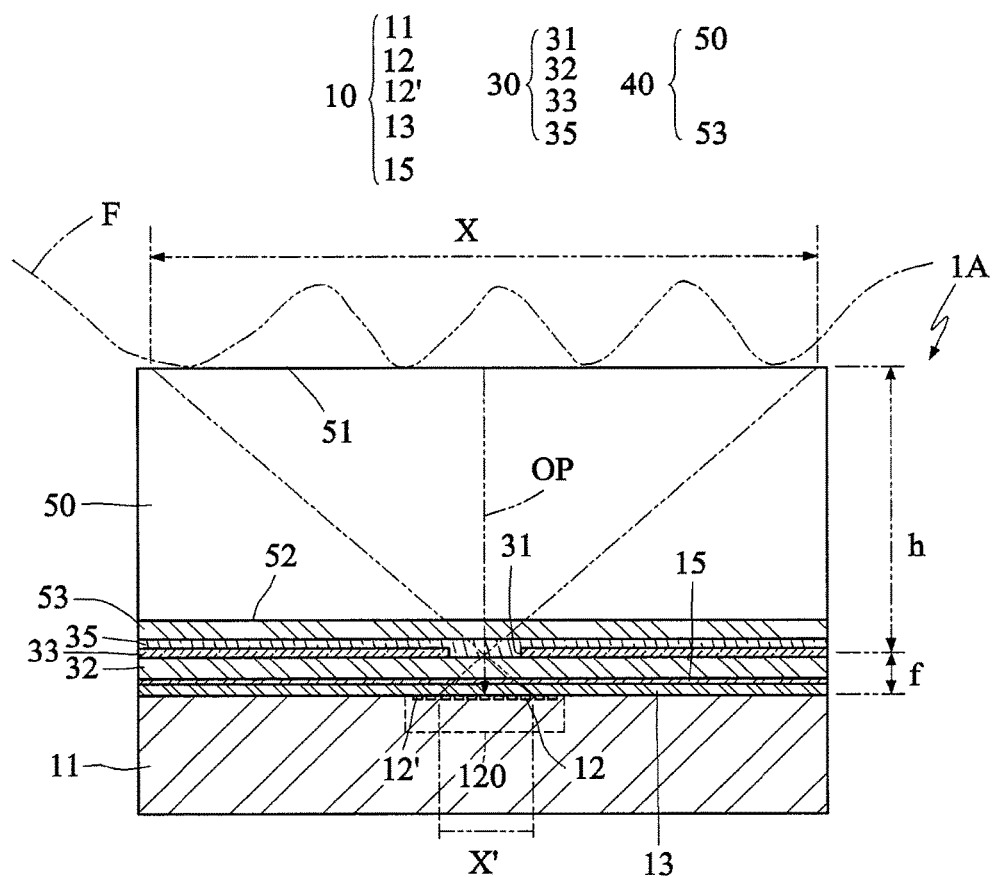
FIG. 8 is a schematic view showing an integrated sensing module according to a second embodiment of the invention.

The invention is directed to the wafer level manufacturing. For the sake of illustration, the schematic scale of the partial chip is described herein. First, an image sensing chip 10 is provided by, for example but without limitation to, the CMOS process for manufacturing the CMOS image sensor (CIS). FIG. 8 is a schematic view showing an integrated sensing module 1A according to the second embodiment of the invention. Referring to FIG. 8, the integrated sensing module 1A of this embodiment includes: an image sensing chip 10 including photo sensing units 12 arranged in a two-dimensional array; a micro-hole layer 30 disposed on the image sensing chip 10 and having a micro hole 31 corresponding to the photo sensing units 12; and a transparent cover assembly 40 disposed on the micro-hole layer 30 and over the image sensing chip 10, wherein the photo sensing units 12 sense, through the micro hole 31, an optical image of an object F disposed on or over the transparent cover assembly 40.

The reason of including the transparent cover assembly 40 is that the size of the overall integrated sensing module (that is, the relative distance between the object space and the image space) must be defined. The transparent cover assembly 40 defines the object distance, and the image distance is defined from the micro-hole layer 30 to the photo sensing unit 12, so that the micro-hole imaging effect can be presented. The image sensing chip 10 may further include additional photo sensing unit 12' disposed on one or multiple sides of the photo sensing units 12. The advantage is that the image sensing chip 10 still can operate normally even if the alignment state is not obtained upon assembling. The photo sensing units 12' and 12 constitute an image sensor 120. In addition, the invention adopts the single micro hole imaging, and another important relationship thereof is that the object dimension X in the object space is not necessarily equal to the image dimension X' in the image space (unless f/h=1), that is, X'/X=f/h (if the imaging aberration is not considered). Of course, the aberration is present in the actual situation, and may affect the detected resolution S in the object space. This represent that the actual physical analytic geometry of the imaging system for imaging the fingerprint, for example, if the resolution must satisfies 500 dpi, then S in the object space must be about 50 um. If the aberration is considered, then S=d(X/X'+1), where d is the aperture of the micro hole. Thus, the whole design rule can be obtained. Thus, the embodiment of the invention is designed based on the principle of satisfying the above-mentioned formula.

In addition, the transparent cover assembly 40 may further be provided with a filter (such as an anti-reflection coating (ARC) layer, a specific light pass layer or the like) disposed on a top surface, a bottom surface or a middle portion of the transparent cover assembly 40. The micro-hole layer 30 may also be provided with a filter disposed on a top surface, a bottom surface or a middle portion of the micro-hole layer 30.

The micro-hole layer 30 and the material of each layer of the transparent cover assembly 40 have the same refractivity or similar refractivities (the difference therebetween ranges between 0% and 30%), so that the light rays can travel in almost the straight line direction. Alternatively, the equivalent refractivity of the micro-hole layer 30 and the equivalent refractivity of the transparent cover assembly 40 are the same or close to each other, and the same effect may also be achieved.

The detailed structure will be described in the following. The image sensing chip 10 includes: a substrate 11, in which the photo sensing units 12 are formed; an inter-metal dielectric layer set 13 formed on the substrate 11; and a first protection layer 15 formed on the inter-metal dielectric layer set 13.

In addition, the micro-hole layer 30 includes: a transparent substrate 32 bonded to the first protection layer 15; a patterned metal layer 33, in which the micro hole 31 is formed; and a second protection layer 35 formed on the transparent substrate 32 and the patterned metal layer 33. It is worth noting that the patterned metal layer 33 may also be replaced with an opaque material layer.

The transparent cover assembly 40 includes: a transparent cover 50; and an adhesive agent 53 adhering the transparent cover 50 to the micro-hole layer 30. An upper surface 51 of the transparent cover 50 touches or approaches the object F. A lower surface 52 of the transparent cover 50 is adhered, by the adhesive agent 53, to the second protection layer 35.

In this embodiment when the aberration is not considered, (the thickness of the transparent cover assembly (including the adhesive) 40)/(the total thickness of the transparent substrate of the micro-hole layer 30, the inter-metal dielectric layer set 13 and the first protection layer 15)=(the sensed surface area of the object F)/(the area imaged on the photo sensing units 12). This is the dimensional relationship between the similar triangles caused by the micro-hole imaging principle to achieve the micro-hole imaging effect.

It is worth noting that the manufacturing method of the second embodiment is similar to the first embodiment, and detailed descriptions thereof will be omitted.

Figure 9:
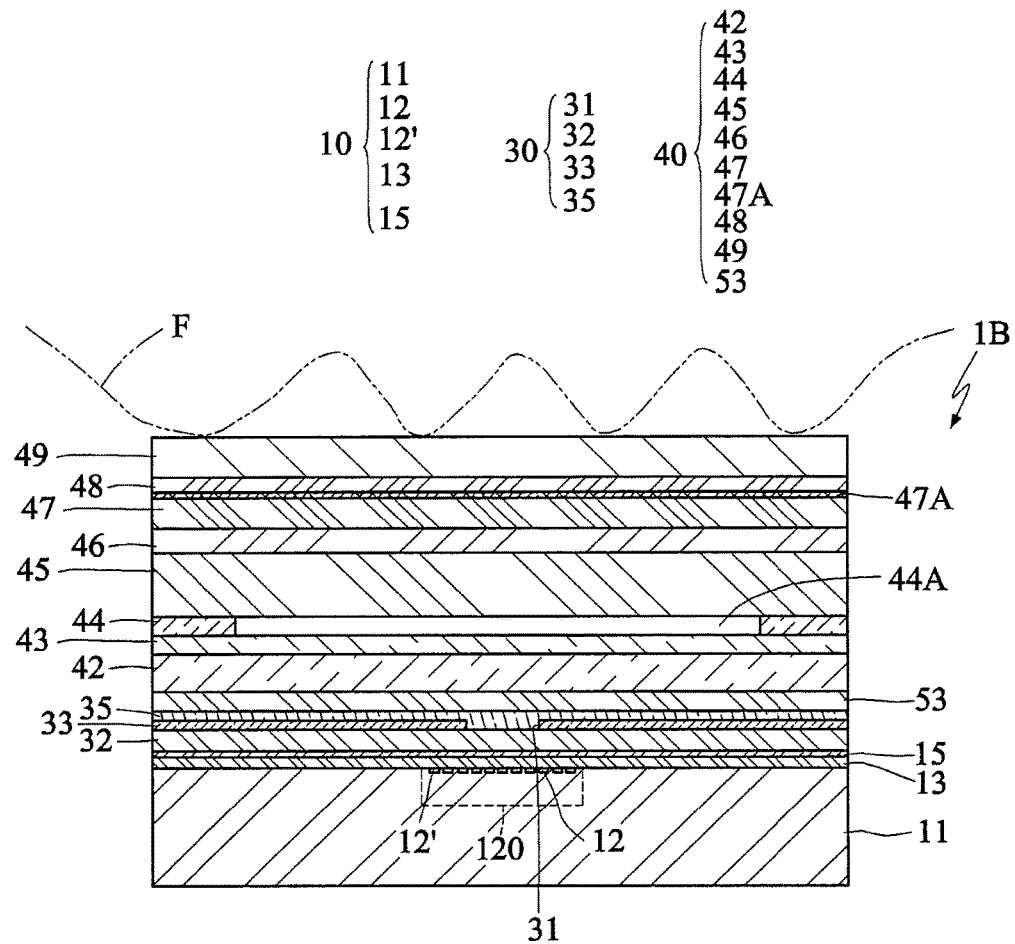
FIG. 9 is a schematic view showing an integrated sensing module according to a third embodiment of the invention.

FIG. 9 is a schematic view showing an integrated sensing module 1B according to a third embodiment of the invention. As shown in FIG. 9, this embodiment is similar to the second embodiment except for the difference that the transparent cover assembly 40 is a portion of an organic light emitting diode (OLED) display or a micro light-emitting diode (LED) display. Thus, the display may provide the light source to illuminate the object.

In this embodiment, the transparent cover assembly 40 includes: an adhesive agent 53; a lower glass plate 42 adhered, by the adhesive agent 53, to the second protection layer 35; a thin film transistor (TFT) layer set (including the protection material of the topmost layer) 43 disposed on the lower glass plate 42; a cathode layer 44, which is disposed on the TFT layer set 43 and has a stop (aperture) 44A; an organic active layer or micro LED layer 45 disposed on the cathode layer 44; an indium tin oxide (ITO) anode layer 46 disposed on the organic active layer or micro LED layer 45; an upper glass plate 47 disposed on the ITO anode layer 46; a polarizer layer 47A disposed on the upper glass plate 47; an adhesive layer 48 disposed on the polarizer layer 47A; and a transparent cover 49 disposed on the adhesive layer 48. The adhesive layer 48 adheres the polarizer layer 47A to the transparent cover 49. The transparent cover 49 is an element approaching or touching the object F. Of course, the above-mentioned description, such as the OLED display structure, may have the increase or decrease of the material layer with the development of the technology, and the spirit of the invention is not changed accordingly.

That is, the image sensing chip 10 of the second embodiment and the micro-hole layer 30 are in contact with the underside of the OLED or Micro LED display (under display), and this embodiment can be completed. The stop 44A is disposed between the upper glass plate 47 of the display and the lower glass plate 42 of the display, and under the organic active layer or micro LED layer 45 of the display, which is disposed between the upper glass plate 47 and the lower glass plate 42. The stop 44A is used to transmit the light and restrict the light amount, and does not directly relate to the pin hole imaging principle. Because the cathode layer 44, such as the aluminum layer, occupies the relatively large area of the display for the purpose of reflecting the light rays of the organic active layer or micro LED layer 45 upwards back to enhance the luminance, the cathode layer 44 is opaque. Thus, one stop 44A needs to be formed for the photo sensing unit 12. Of course, the stop 44A may also be accomplished by the material of the existing OLED structure layer, or by adding a new structure layer, such as a black glue layer. This has the flexibility in manufacturing, and does not restrict the spirit of the invention.

Figure 10:
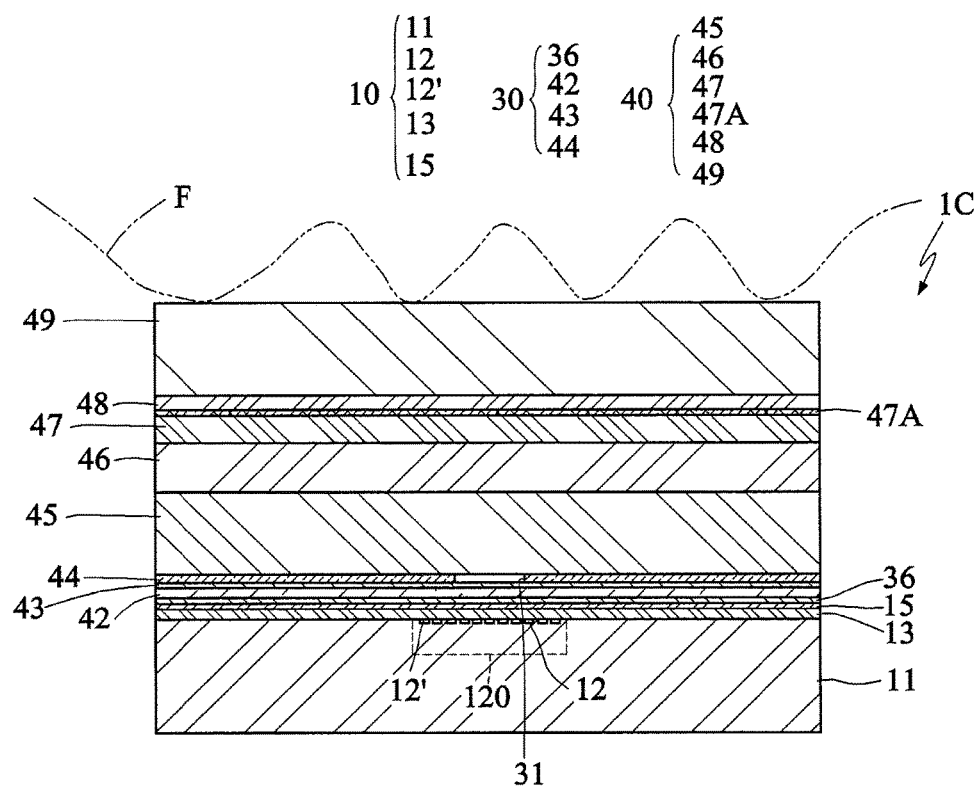
FIG. 10 is a schematic view showing an integrated sensing module according to a fourth embodiment of the invention.

FIG. 10 is a schematic view showing an integrated sensing module 1C according to a fourth embodiment of the invention. Referring to FIG. 10, this embodiment is similar to the second embodiment except for the difference that the transparent cover assembly 40 and the micro-hole layer 30 constitutes a portion of an OLED display or a micro LED display.

In this embodiment, the micro-hole layer 30 includes: an adhesive agent 36 (also referred to as an adhesive layer); a lower glass plate 42, wherein the adhesive agent 36 adheres the lower glass plate 42 to the first protection layer 15; a TFT layer set 43 disposed on the lower glass plate 42; and a cathode layer 44 having the micro hole 31. Of course, this micro hole 31 may be accomplished by the material of the existing OLED structure layer, or by adding a new structure layer, such as a black glue layer. This has the flexibility in manufacturing, and does not restrict the spirit of the invention.

The transparent cover assembly 40 includes: an organic active layer or micro LED layer 45 formed on the cathode layer 44; an ITO anode layer 46 formed on the organic active layer or micro LED layer 45; an upper glass plate 47 formed on the ITO anode layer 46; a polarizer layer 47A disposed on the upper glass plate 47; an adhesive layer 48 disposed on the polarizer layer 47A; and a transparent cover 49 disposed on the adhesive layer 48. The adhesive layer 48 adheres the transparent cover 49 to the polarizer layer 47A. Thus, the display may provide the light source to the object F. Alternatively, another light source may also be disposed on one or multiple sides of the transparent cover assembly to input the infrared light (the display cannot provide the infrared light) or other special wavelengths of light.

Figure 11:
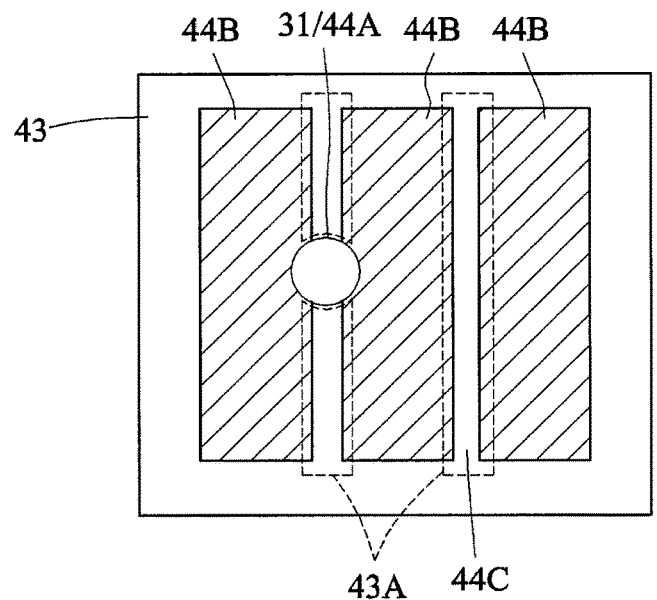
FIGS. 11 and 12 show two examples of formation positions of stops or micro-holes.
Figure 12:
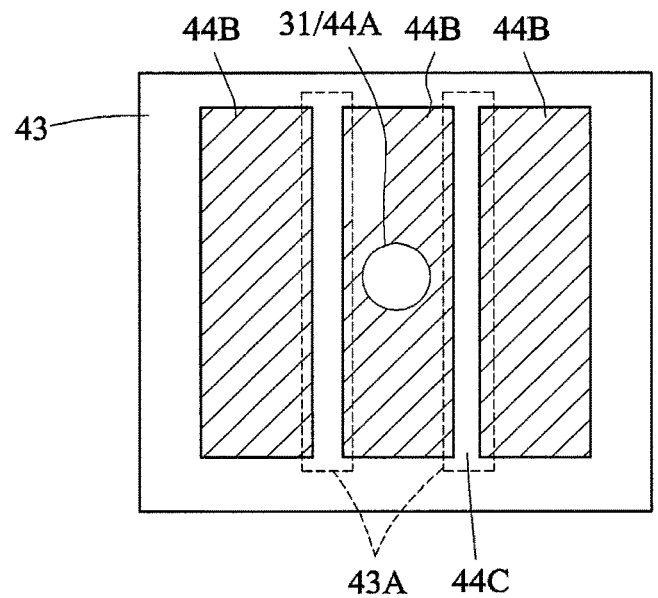

FIGS. 11 and 12 show two examples of formation positions of the stops 44A or micro-holes 31. As shown in FIG. 11, the stop 44A or the micro hole 31 is formed in and between two electrode plates 44B of the neighboring cathode layers 44, so the TFT layer set 43 under the cathode layer 44 also provide a portion for the formation of the stop 44A or micro hole 31. In one example, the horizontal width of one single electrode plate 44B is about 30 um (microns), and the horizontal gap between the two electrode plates 44B is about 2 to 3 um. The dimension of the stop 44A or the micro hole 31 is about 10 to 25 um, so the stop or micro hole needs to cross two electrode plates 44B. As shown in FIG. 12, the stop 44A or the micro hole 31 may also be completely formed in one single electrode plate 44B, but the TFT layer set 43 under the electrode plate 44B also needs to provide a transparent or hollow portion to let the light rays pass.

It is worth noting that the gap 44C between the electrode plates 44B of the cathode layer 44 of FIG. 11 may be designed to obstruct the light and form the opaque state through the light obstructing layer 43A formed by the conductor of the TFT layer set 43 (e.g., the polysilicon) to prevent the diffraction light from affecting the sensing effect of pin hole imaging. It is worth noting that the light obstructing layer 43A is not designed in the single OLED or micro LED display, but has the effect and value in this embodiment in order to prevent the diffraction light from affecting the sensing effect of pin hole imaging.

Figure 13A:
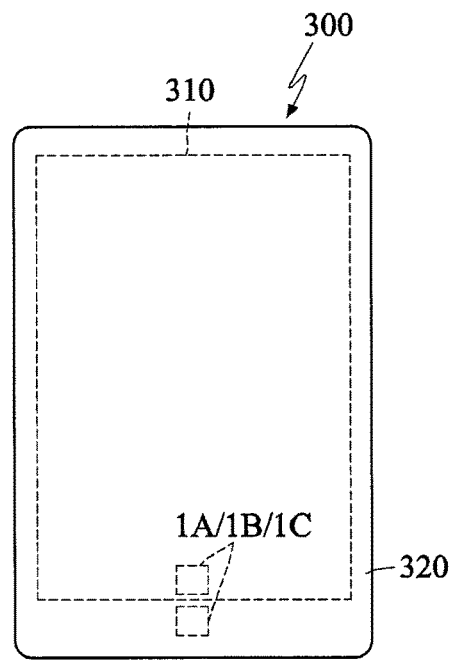
FIG. 13A shows one example of an electronic device according to the preferred embodiment of the invention.

FIG. 13A shows one example of an electronic device 300 according to the preferred embodiment of the invention. Referring to FIG. 13A, the electronic device 300, such as a smart phone, including a display 310 and a transparent cover 320 disposed on the display 310. The electronic device 300 may be installed with the integrated sensing module 1A, 1B or 1C, more particularly an under-cover integrated sensing module, and may also be installed with the integrated sensing module 1A, 1B or 1C, which is an under-display integrated sensing module (such installation is applicable to any display position).

Figure 13B:
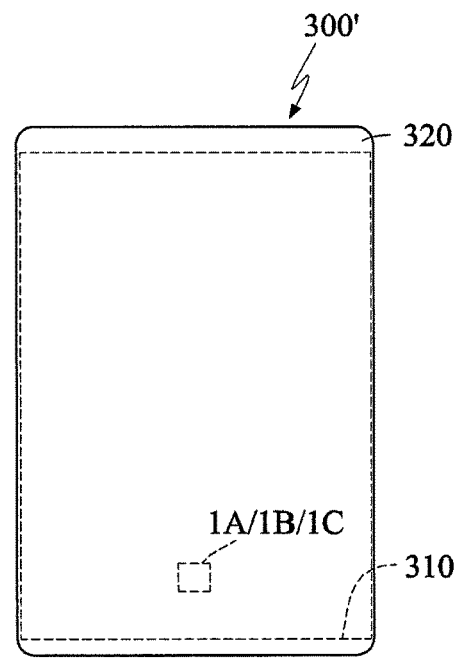
FIG. 13B shows another example of the electronic device according to the preferred embodiment of the invention.

Of course, the OLED or micro LED display pertains to the prior art, the invention is described only based on the portion of the main structure without re-defining the structure and material thereof, wherein the portions of the display, which are not described in detail, may be referred to the existing art without affecting the creation of the embodiment of the invention. The most important characteristic of this embodiment is to make the user obtain the display content and biometrics recognition ability concurrently at any specified position of the display (any specified position of the display can execute the displaying and biometrics characteristics sensing), and such design is not available in the present market. That is, displaying and biometrics characteristics sensing can be executed at a predetermined position of the transparent cover since the display is disposed under the transparent cover. This is very important to the design of the product, such as the mobile phone and can have a whole new industrial design, the narrow border and the full screen concept. FIG. 13B shows another example of an electronic device 300' according to the preferred embodiment of the invention. Referring to FIG. 13B, the electronic device 300', such as a smart phone, includes a display 310 and a transparent cover 320 disposed on the display 310. The display 310 is present in a full screen pattern. The electronic device 300' may be installed with the integrated sensing module 1A, 1B or 1C.

Figure 14:
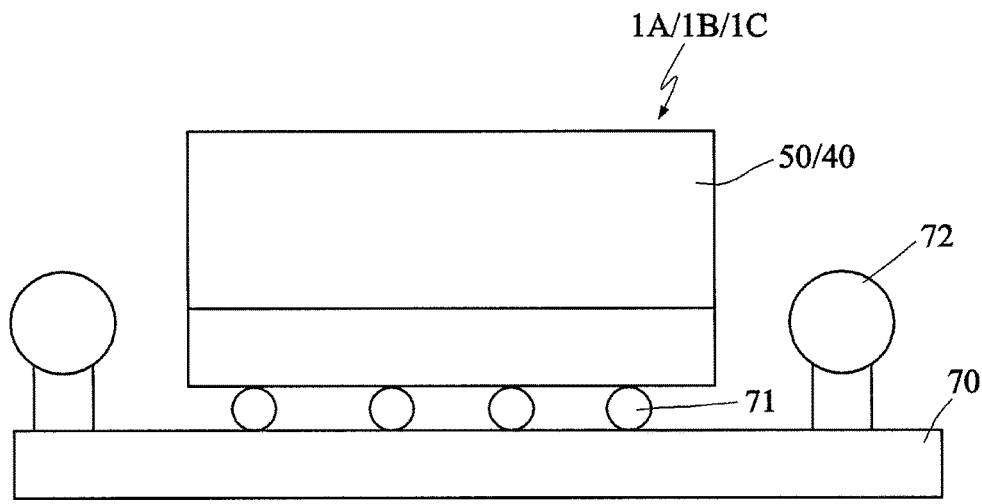
FIGS. 14 and 15 show two applications of the integrated sensing module according to the preferred embodiment of the invention.
Figure 15:
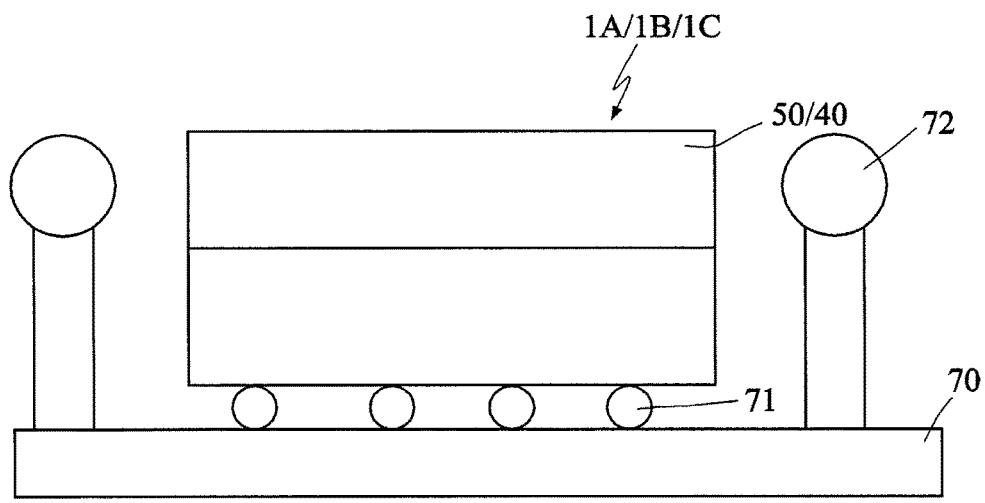

FIGS. 14 and 15 show two applications of the integrated sensing module 1A/1B/1C (referred to as the integrated sensing assembly) according to the preferred embodiment of the invention. As shown in FIG. 14, the integrated sensing module may have the bonding pads disposed on the backside by way of through silicon via (TSV) or wiring from the lateral side, and then bonded to a circuit board (especially a flexible circuit board) 70 through solder balls 71. A light source 72 is also disposed on the flexible circuit board 70, and the light rays of the light source may be guided to the object through light guide plates (not shown). The architecture of FIG. 15 is similar to that of FIG. 14 except for the difference that the light source 72 is almost horizontally projected into the transparent cover 50, and the light rays are projected onto the object according to the waveguide principle. Thus, the light source may be disposed on one or multiple sides of the transparent cover assembly 40, or may be disposed on the same or different levels (heights), and the light rays may enter the transparent cover assembly 40 from the side surface of the transparent cover assembly 40 and projected onto the object F according to the waveguide principle.

Figure 16:
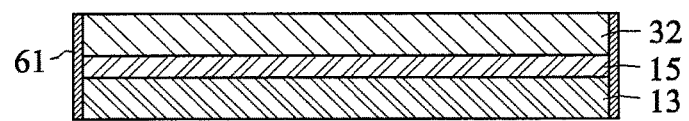
FIG. 16 is a schematic view showing an application of the obstructing glue.

The embodiment of the invention embodiment further includes the application of the obstructing glue 61 shown in FIG. 16. As shown in FIG. 16, the obstructing glue 61 is coated onto the periphery of the inter-metal dielectric layer set 13, the first protection layer 15 and the transparent substrate 32 to prevent the light rays from being outputted or entering to cause the interference, so that a perfect darkroom can be formed.

Therefore, the single micro hole can be used to perform the optical image sensing, and the integrated sensing module may be further integrated with a display easily to achieve the display, touch and fine biometrics characteristics sensing effects.

Figure 17:
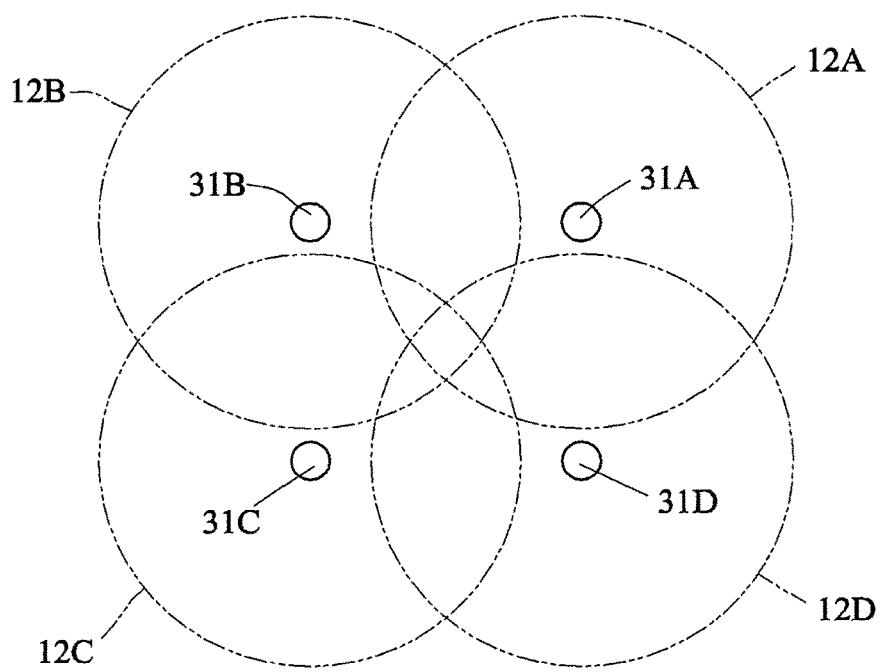
FIG. 17 shows an application of an integrated sensing module having multiple micro holes according to a fifth embodiment of the invention.

FIG. 17 shows an application of an integrated sensing module having multiple micro holes according to the fifth embodiment of the invention. In this non-restrictive embodiment, four micro holes 31A to 31D are present, and correspond to four overlapping sensing ranges 12A to 12D of four sensing unit arrays. This can enlarge the sensing surface area of the integrated sensing module, and is further applicable to the under-display application of FIG. 13B. For example, if the original single micro hole corresponds to the sensing surface area of 5 mm*5 mm, then the sensing surface area can be enlarged into 10 mm*10 mm when four micro holes are adopted, and the area of the whole finger can be sensed at a time. In addition, the total light amount of all the micro holes is increased to obtain the better sensing result, wherein the false acceptance rate (FAR) and false rejection rate (FRR) thereof are further improved, and the alignment state between the finger and the integrated sensing module also needs not to be very stringent. The sensing results obtained by the sensing ranges 12A to 12D may be processed independently, or may be stitched into a large sensed image by way of union. It is worth noting that although four micro holes are described as an example, another number of micro holes may also be used to implement the invention.

Figure 18:
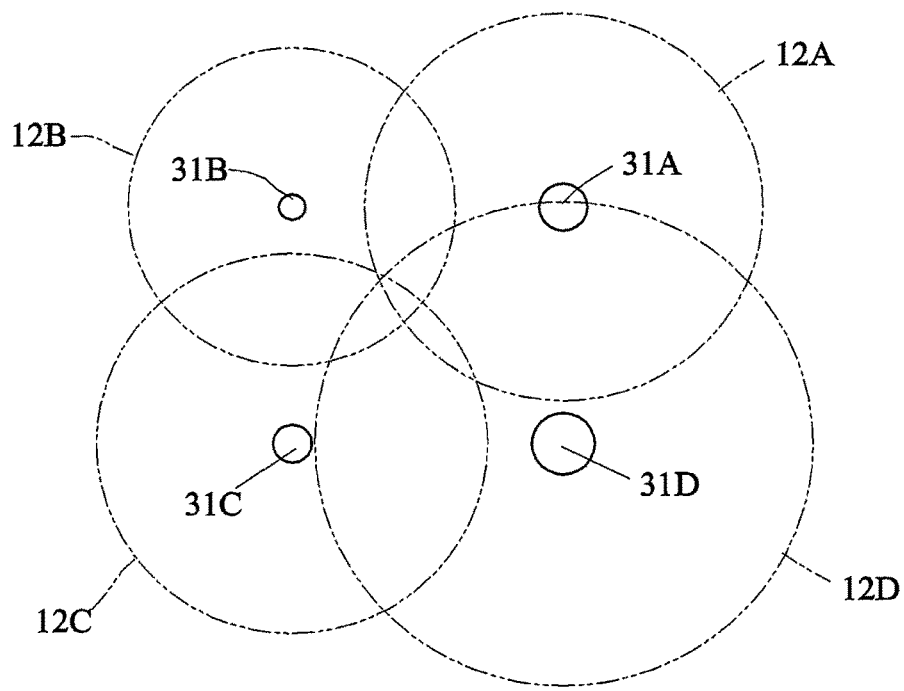
FIG. 18 shows an application of an integrated sensing module having multiple micro holes according to the fifth embodiment of the invention.

The sensing ranges 12A to 12D of FIG. 17 have the same dimension. However, the invention is not restricted thereto. FIG. 18 shows an application of an integrated sensing module having multiple micro holes according to the fifth embodiment of the invention. In the non-restrictive embodiment similar to FIG. 17, four micro holes 31A to 31D have different dimensions, and four overlapped sensing ranges 12A to 12D corresponding to four sensing unit arrays also have different dimensions. Different wavelengths of light sources pass through different micro holes, so that different depths of images can be sensed. For example, the skin layer, the dermal layer and the finger vein image of the same finger are sensed at the same time, so that multiple biometrics characteristics can be obtained at a time. In addition, the finger may also be moved over the sensing region in the up, down, left and right directions, so that the image-stitching effect of multiple partial biometrics characteristics may be obtained.

With the above-mentioned embodiment, an integrated sensing module may be provided, wherein the semiconductor wafer manufacturing method is utilized to stack the optical module onto the optical sensing chip by way of wafer stacking to complete the structure thereof and overcome all the drawback of the prior art, so that the size is minimized, the manufacturing processes are standardized, the quality is easily controlled, and the cost is advantageously decreased. One single micro hole or multiple micro holes may be utilized to perform the optical image sensing effect, and the integrated sensing module may be further integrated with a display easily to achieve the display, touch and fine biometrics characteristics sensing effects.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An integrated sensing module, comprising:
   an image sensing chip comprising photo sensing units arranged in a two-dimensional array;
   a micro-hole layer disposed on the image sensing chip and having one or multiple micro holes corresponding to the photo sensing units; and
   a display panel assembly structure having a transparent cover and a display, which displays contents and is disposed under the transparent cover and disposed over the image sensing chip, wherein the photo sensing units sense an optical image of an object through the one or multiple micro holes and an optical path passing through a stop of an opaque layer of the display, and displaying and biometrics characteristics sensing can be executed at a predetermined position of the transparent cover, under which the stop is disposed.

2. The integrated sensing module according to claim 1, wherein the image sensing chip comprises:
   a substrate;
   the photo sensing units formed in the substrate;

an inter-metal dielectric layer set and a metal connection layer disposed on the substrate and the photo sensing units;

an upper metal layer disposed on the inter-metal dielectric layer set; and a protection layer disposed on the inter-metal dielectric layer set and the upper metal layer, wherein the upper metal layer obstructs partial light rays from the one or multiple micro holes to the photo sensing units.

3. The integrated sensing module according to claim 1, wherein the stop is disposed between an upper glass plate of the display and a lower glass plate of the display, the micro-hole layer comprises a patterned optical substrate, the patterned optical substrate comprises an optical filter, and the optical filter is disposed in or over the patterned optical substrate, or between the image sensing chip and the patterned optical substrate.

4. The integrated sensing module according to claim 1, wherein a first portion of a patterned optical substrate corresponding to the micro holes has a light converging or diverging effect, and a second portion of the patterned optical substrate corresponding to the micro holes does not have the light converging or diverging effect, so that the integrated sensing module senses different depths of images.

5. The integrated sensing module according to claim 1, wherein the micro holes have multiple sets of apertures and are staggered, and work in conjunction with different wavelengths of light sources, so that the integrated sensing module senses different depths of images.

6. The integrated sensing module according to claim 1, wherein the micro holes correspond to multiple overlapped sensing ranges.

7. The integrated sensing module according to claim 1, wherein the micro hole corresponds to the photo sensing units in a one-to-many manner, and the photo sensing units obtain the optical image according to an imaging principle of the one micro hole.

8. The integrated sensing module according to claim 7, wherein the photo sensing units sense the optical image of the object disposed on or over the display panel assembly structure through the micro hole.

9. The integrated sensing module according to claim 1, wherein the display panel assembly structure is a portion of an organic light emitting diode (OLED) display or a micro light-emitting diode (LED) display, and the stop is disposed between an upper glass plate of the display and a lower glass plate of the display and under an organic active layer or a micro LED layer of the display, which is disposed between the upper glass plate and the lower glass plate.

10. The integrated sensing module according to claim 1, wherein the image sensing chip further comprises multiple additional photo sensing units disposed on one or multiple sides of the photo sensing units.

11. The integrated sensing module according to claim 1, wherein the image sensing chip comprises: a substrate, in which the photo sensing units are formed; an inter-metal dielectric layer set formed on the substrate; and a first protection layer formed on the inter-metal dielectric layer set.

12. The integrated sensing module according to claim 11, wherein the micro-hole layer comprises: a patterned optical substrate bonded to the first protection layer.

13. The integrated sensing module according to claim 12, wherein an obstructing glue is coated around the inter-metal dielectric layer set, the first protection layer and the patterned optical substrate to form a darkroom.

14. The integrated sensing module according to claim 1, wherein the display panel assembly structure and the micro-hole layer constitute a portion of an organic light emitting diode (OLED) display or micro light-emitting diode (LED) display.

15. The integrated sensing module according to claim 14, wherein the display panel assembly structure comprises: a first adhesive layer; a lower glass plate adhered to a protection layer of the micro-hole layer by the first adhesive layer; a thin film transistor (TFT) layer set disposed on the lower glass plate; a cathode layer disposed on the TFT layer set and having the stop; an organic active layer or a micro LED layer disposed on the cathode layer; an indium tin oxide (ITO) anode layer disposed on the organic active layer or the micro LED layer; an upper glass plate disposed on the ITO anode layer; a polarizer layer disposed on the upper glass plate; a second adhesive layer disposed on the polarizer layer; and a transparent cover disposed on the second adhesive layer, wherein the second adhesive layer adheres the polarizer layer to the transparent cover.

16. The integrated sensing module according to claim 14, wherein the micro-hole layer comprises: a first adhesive layer; a lower glass plate, wherein the first adhesive layer adheres the lower glass plate to a protection layer of the image sensing chip; a thin film transistor (TFT) layer set disposed on the lower glass plate; and a cathode layer having the micro hole, wherein the display panel assembly structure comprises: an organic active layer or a micro LED layer formed on the cathode layer; an indium tin oxide (ITO) anode layer formed on the organic active layer or the micro LED layer; an upper glass plate formed on the ITO anode layer; a polarizer layer disposed on the upper glass plate; a second adhesive layer disposed on the polarizer layer; and a transparent cover disposed on the second adhesive layer, wherein the second adhesive layer adheres the transparent cover to the polarizer layer.

17. The integrated sensing module according to claim 16, wherein the micro hole is formed on and between neighboring two electrode plates of the cathode layer or is formed in one single electrode plate of the cathode layer.

18. An integrated sensing assembly, comprising:
a circuit board;
a light source disposed on the circuit board;
the integrated sensing module according to claim 1, wherein the integrated sensing module is disposed on the circuit board and electrically connected to the circuit board, the light source is disposed on one or multiple sides of the display panel assembly structure, and light rays of the light source project from a side surface of the display panel assembly structure onto the object.

19. The integrated sensing module according to claim 1, wherein the opaque layer is an opaque cathode layer.

20. An integrated sensing module, comprising:
an image sensing chip comprising photo sensing units arranged in a two-dimensional array;
a micro-hole layer disposed on the image sensing chip and having one or multiple micro holes corresponding to the photo sensing units; and
a display panel assembly structure having a transparent cover and a display, which displays contents and is disposed under the transparent cover and disposed over the image sensing chip, wherein the photo sensing units sense an optical image of an object through the one or multiple micro holes and an optical path passing through the display having a partial transparent design to facilitate the optical path to pass, and displaying and biometrics characteristics sensing can be executed at a predetermined position of the transparent cover, under which the partial transparent design is disposed.

\* \* \* \* \*